(12) United States Patent
Khan et al.

(10) Patent No.: US 7,078,806 B2
(45) Date of Patent: Jul. 18, 2006

(54) IC DIE SUPPORT STRUCTURES FOR BALL GRID ARRAY PACKAGE FABRICATION

(75) Inventors: Reza-ur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/899,144

(22) Filed: Jul. 27, 2004

(65) Prior Publication Data
US 2004/0262754 A1 Dec. 30, 2004

Related U.S. Application Data

(63) Continuation of application No. 10/284,349, filed on Oct. 31, 2002, now Pat. No. 6,825,108.

(60) Provisional application No. 60/352,877, filed on Feb. 1, 2002.

(51) Int. Cl.
H01L 23/48 (2006.01)
(52) U.S. Cl. .................... 257/734; 257/738
(58) Field of Classification Search ........ 257/734–740, 257/678–680
See application file for complete search history.

(56) References Cited

U.S. PATENT DOCUMENTS

| | | |
|---|---|---|
| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |

(Continued)

FOREIGN PATENT DOCUMENTS

EP 0 573 297 A2 12/1993

(Continued)

OTHER PUBLICATIONS

Amkor package data sheet, "SuperFC®", from http://www.amkor.com/Products/all_datasheets/superfc.pdf, 2 pages (Jan. 2003).

(Continued)

*Primary Examiner*—Hoai Pham
*Assistant Examiner*—Nathan W. Ha
(74) *Attorney, Agent, or Firm*—Sterne, Kessler, Goldstein & Fox PLLC

(57) ABSTRACT

A system and method of assembling a ball grid array (BGA) package with IC die support is described. A stiffener is attached to a substrate that includes a centrally located opening with an integrated circuit (IC) die support structure removably held therein. An IC die is mounted to a central region of the stiffener. Further assembly process steps may be performed on the BGA package with IC die support. The IC die support structure is removed from the centrally located opening. In aspects of the invention, the IC die support structure is removably held in the opening by an adhesive tape or by one or more substrate tabs.

22 Claims, 16 Drawing Sheets

U.S. PATENT DOCUMENTS

| | | |
|---|---|---|
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A | 5/2000 | Jamieson et al. |
| 6,064,111 A | 5/2000 | Sota et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B1 | 2/2002 | Iijima et al. |
| 6,362,525 B1 | 3/2002 | Rahim |
| 6,365,980 B1 | 4/2002 | Carter, Jr. et al. |
| 6,369,455 B1 | 4/2002 | Ho et al. |
| 6,380,623 B1 | 4/2002 | Demore |
| 6,462,274 B1 | 10/2002 | Shim et al. |
| 6,472,741 B1 | 10/2002 | Chen et al. |
| 6,525,942 B1 | 2/2003 | Huang et al. |
| 6,528,869 B1 | 3/2003 | Glenn et al. |
| 6,528,892 B1 | 3/2003 | Caletka et al. |
| 6,541,831 B1 | 4/2003 | Lee et al. |
| 6,545,351 B1 | 4/2003 | Jamieson et al. |
| 6,552,266 B1 | 4/2003 | Carden et al. |
| 6,552,428 B1 | 4/2003 | Huang et al. |
| 6,552,430 B1 | 4/2003 | Perez et al. |
| 6,563,712 B1 | 5/2003 | Akram et al. |
| 6,583,516 B1 | 6/2003 | Hashimoto |
| 6,602,732 B1 | 8/2003 | Chen |
| 6,614,660 B1 | 9/2003 | Bai et al. |
| 6,617,193 B1 | 9/2003 | Toshio et al. |
| 6,657,870 B1 | 12/2003 | Ali et al. |
| 6,664,617 B1 | 12/2003 | Siu |
| 6,667,541 B1 * | 12/2003 | Minamio et al. ........... 257/666 |
| 6,724,071 B1 | 4/2004 | Combs |
| 6,724,080 B1 | 4/2004 | Ooi et al. |
| 6,927,478 B1 * | 8/2005 | Paek .......................... 257/666 |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096767 A1 | 7/2002 | Cote et al. |
| 2002/0098617 A1 | 7/2002 | Lee et al. |
| 2002/0109226 A1 | 8/2002 | Khan et al. |
| 2002/0135065 A1 | 9/2002 | Zhao et al. |
| 2002/0160552 A1 * | 10/2002 | Minamio et al. ........... 438/108 |
| 2002/0171144 A1 | 11/2002 | Zhang et al. |
| 2002/0180040 A1 | 12/2002 | Camenforte et al. |
| 2002/0185717 A1 | 12/2002 | Eghan et al. |
| 2002/0185720 A1 | 12/2002 | Khan et al. |
| 2002/0185722 A1 | 12/2002 | Zhao et al. |
| 2002/0185734 A1 | 12/2002 | Zhao et al. |
| 2002/0185750 A1 | 12/2002 | Khan et al. |
| 2002/0190361 A1 | 12/2002 | Zhao et al. |
| 2002/0190362 A1 | 12/2002 | Khan et al. |
| 2003/0057550 A1 | 3/2003 | Zhao et al. |
| 2003/0111726 A1 | 6/2003 | Khan et al. |
| 2003/0138613 A1 | 7/2003 | Thoman et al. |
| 2003/0146503 A1 | 8/2003 | Khan et al. |
| 2003/0146506 A1 | 8/2003 | Khan et al. |
| 2003/0146509 A1 | 8/2003 | Zhao et al. |
| 2003/0146511 A1 | 8/2003 | Zhao et al. |
| 2003/0179549 A1 | 9/2003 | Zhong et al. |
| 2003/0179556 A1 | 9/2003 | Zhao et al. |
| 2004/0072456 A1 | 4/2004 | Dozier, II et al. |
| 2004/0113284 A1 | 6/2004 | Zhao et al. |
| 2005/0051890 A1 * | 3/2005 | Zhang et al. ................ 257/712 |
| 2005/0077613 A1 * | 4/2005 | McLellan et al. ........... 257/706 |

FOREIGN PATENT DOCUMENTS

| | | |
|---|---|---|
| EP | 0 504 411 B1 | 6/1998 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |

OTHER PUBLICATIONS

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging And Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings Of The 2001 International Conference On Computer-Aided Design*, pp. 651-654 (Nov. 4-8, 2001.

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal Of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).

Ahn, S.H. and Kwon, Y.S., "Popcorn Phenomena in a Ball Grid Array Package", *IEEE Transactions on Components, Packaging, and Manufacturing Technology Part B: Adavnaced Packaging*, IEEE, Aug. 1995, vol. 18, No. 3, pp. 491-495.

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1996, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Mode and Root Cause Analysis", *Surface Mount International, Proceedings of The Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Test: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin-Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue to Evolve", *Electronic Design*, Feb. 6, 1995, pp. 141-146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, Vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachuesetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Karnezos, M., "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation fo Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI LOGIC Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New Super BGA® Package", *1995 International Electronics Packaging Conference*, San Diego, California, Sep. 24-27, 1995, pp. 565-576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection for Flip Chip Attach Using Digital Tomosynthesis", *Surface Mount International Proceedings of The Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas, Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorial and Short Courses", *45th Electronic Components & Technology Conference*, May 21-24, 1995, Las Vegas, Nevada, IEEE, 4 pages.

Vardaman, E. J. and Crowley, R.T., "Worldwide Trends in Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplment)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Zhao et al., U.S. Appl. No. 10/284,340, filed Oct. 31, 2002, entitled "Ball Grid Array Package With Patterned Stiffener Layer," 137 pages.

* cited by examiner stiffener temperature distribution

IC DIE SUPPORT STRUCTURES FOR BALL GRID ARRAY PACKAGE FABRICATION

CROSS-REFERENCE TO RELATED APPLICATIONS

This application is a continuation of U.S. application Ser. No. 10/284,349, titled, "Ball Grid Array Package Fabrication With IC Die Support Structures," filed Oct. 31, 2002, now U.S. Pat. No. 6,825,108, which claims the benefit of U.S. Provisional Application No. 60/352,877, filed Feb. 1, 2002, both of which are herein incorporated by reference in their entireties.

The following applications of common assignee are related to the present application, have the same filing date as the present application, and are herein incorporated by reference in their entireties:

"Ball Grid Array Package Enhanced with a Thermal and Electrical Connector," Ser. No. 10/284,312;

"Ball Grid Array Package with Patterned Stiffener Layer," Ser. No. 10/284,340;

"Ball Grid Array Package with Stepped Stiffener Layer," Ser. No. 10/284,371;

"Array Package with Multiple Interposers," Ser. No. 10/284,166, and

"Ball Grid Array Package with Separated Stiffener Layer," Ser. No. 10/284,366.

BACKGROUND OF THE INVENTION

1. Field of the Invention

The invention relates generally to the field of integrated circuit (IC) device packaging technology and, more particularly, to techniques for providing support to a ball grid array (BGA) packages during assembly processes.

2. Related Art

Integrated circuit (IC) dies are typically mounted in or on a package that facilitates attachment to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. In one type of BGA package, the IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the package, opposite of the side to which the solder balls are attached. In die-down BGA packages, the IC die is mounted on a bottom surface of the package, on the same side as which the solder balls are attached.

Various assembly process steps for the BGA package may cause harmful stresses and shocks to the IC die. These process steps include attachment of the IC die to the BGA package, attachment of wire bonds, encapsulation of the IC die and wire bonds for environmental protection, attachment of solder balls to the BGA package, and other steps. As a result of the stress occurring during these processes, the package stiffener may become deformed. The deformation of the stiffener may lead to the formation of cracks in the IC die, potentially rendering the IC die inoperable. Hence, costs in terms of lost money and time may be incurred for repairing and replacing damaged IC dies and BGA packages, among other costs.

Hence, what is needed are improved BGA package assembly processes that reduce stresses and shocks that may harm the BGA package.

BRIEF SUMMARY OF THE INVENTION

Ball grid array (BGA) packages having enhanced electrical, thermal, and mechanical characteristics are described herein. In particular, improved assembly processes and structures are described. In an aspect of the present invention, a system and method of assembling a BGA package with integrated circuit (IC) die support are described. A stiffener is attached to a substrate that includes a centrally located opening with an IC die support structure removably held therein. An IC die is mounted to a central region of the stiffener. The IC die support structure is subsequently removed from the centrally located opening.

In a further aspect, additional assembly process steps in addition to mounting the IC die are performed before removing the IC die support structure. Such additional steps include, for example, connecting a bond pad of the IC die to a contact pad on the substrate with a wire bond. In another aspect, the IC die is encapsulated on the stiffener. The IC die support structure supports the stiffener during one or more of these assembly process steps to reduce deformation of the stiffener and damage to the IC die.

In an aspect of the present invention, the IC die support structure is attached to the substrate by an adhesive tape. The adhesive tape to which the IC die support structure is attached removably holds the IC die support structure within the centrally located opening. The applied adhesive tape is detached from the substrate to remove the IC die support structure from the centrally located opening.

In another aspect of the present invention, the IC die support structure is formed in the opening as a portion of the substrate. The IC die support structure portion of the substrate remains removably held in the opening by one or more substrate tabs. The one or more substrate tabs are broken to release the IC die support structure from the centrally located opening.

In another aspect of the present invention, a system and method of assembling a plurality of BGA packages is described. A substrate strip that includes a plurality of substrates that each include a centrally located opening with an IC die support structure removably held therein is formed. A stiffener strip that includes a plurality of stiffeners is attached to the substrate strip such that a first surface of each stiffener of the plurality of stiffeners is attached to a first surface of a corresponding substrate of the plurality of substrates. An IC die is mounted to a central region of a second surface of each stiffener of the plurality of stiffeners. A bond pad of the IC die mounted to each stiffener of the plurality of stiffeners is connected to a contact pad on the first surface of the corresponding substrate of the plurality of substrates with a wire bond. The IC die and the wire bond are encapsulated on the second surface of each stiffener of the plurality of stiffeners. The IC die support structure is subsequently removed from the centrally located opening of each substrate of the plurality of substrates.

Further aspects, features, and advantages of the present invention, as well as the structure and operation of the various embodiments of the present invention, are described in detail below with reference to the accompanying drawings.

BRIEF DESCRIPTION OF THE
DRAWING/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 18A:
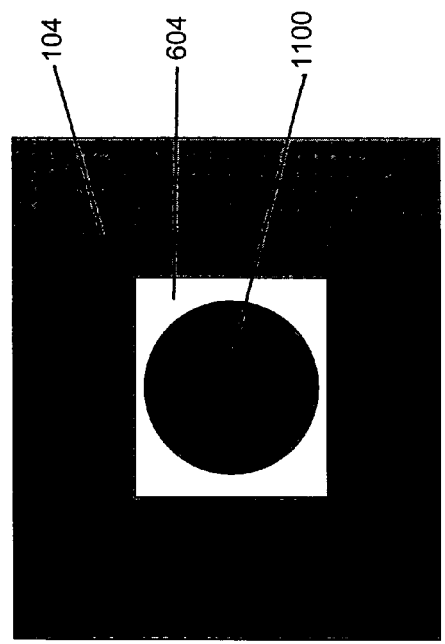
Figure 18B:
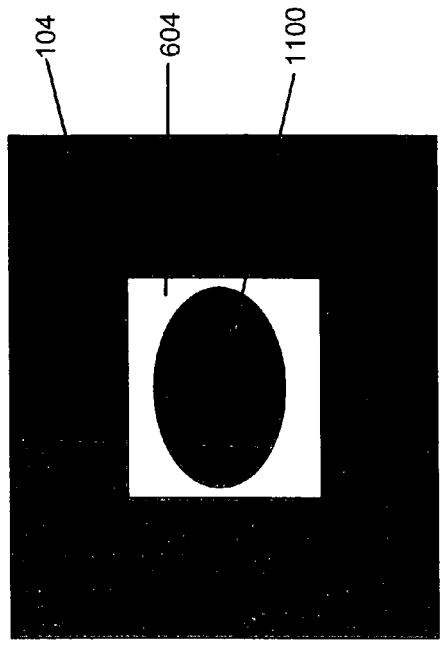
Figure 18C:
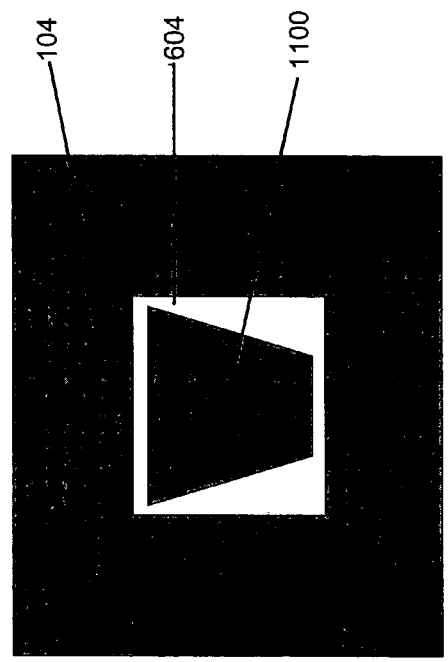

FIGS. 18A, 18B, and 18C illustrate bottom views of a substrate with example IC die support structures having various shapes, according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE
INVENTION

Overview

The present invention is directed to a method and system for improving assembly processes for BGA packages, and therefore to improving the mechanical, thermal, and electrical performance of BGA packages. The present invention is applicable BGA packages of all types of BGA substrates, including ceramic, plastic, and tape (flex) substrates. Furthermore the present invention is applicable to die-up (cavity-up) and die-down (cavity-down) orientations.

Numerous embodiments of the present invention are presented herein. First, ball grid array package types are described below. Next, further detail on the above described embodiments for assembling BGA packages with IC die support, and additional embodiments according to the present invention, are described. The embodiments described herein may be combined as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover most or all of the bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., Ball Grid Array Technology, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

Figure 1A:
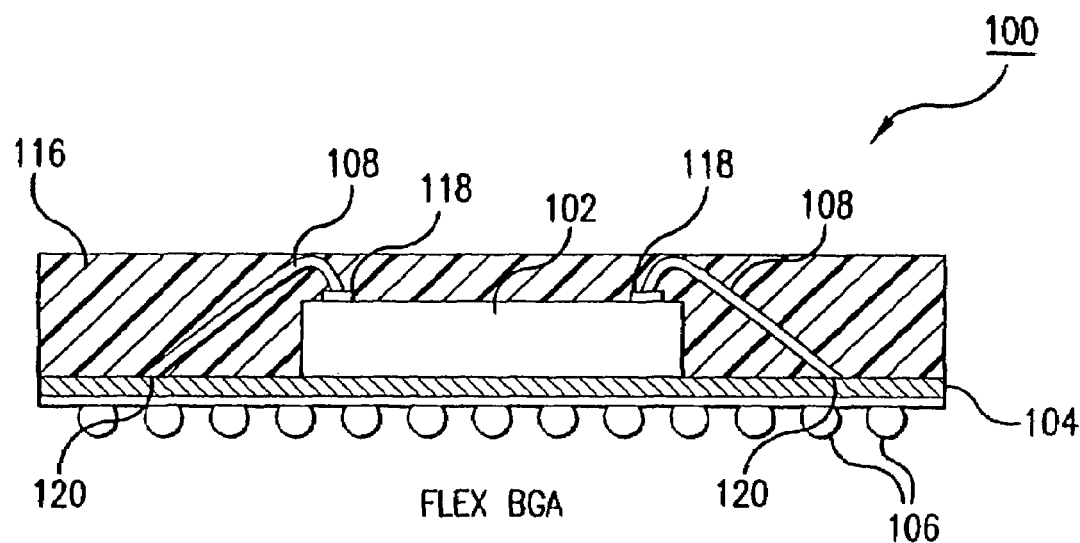
FIGS. 1A and 1B illustrate cross-sectional views of flex BGA packages.

A number of BGA package substrate types exist, including ceramic, plastic (PBGA), and tape (also known as "flex") (for example, refer to Hayden, T.F., et al., Thermal & Electrical Performance and Reliability Results for Cavity-Up Enhanced BGAs, Electronic Components and Technology Conference, IEEE, pp. 638–644 (1999), which is incorporated herein by reference). FIG. 1A illustrates a flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of inputs and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy. IC die 102 is any type of semiconductor IC.

One or more wire bonds 108 connect corresponding bond pads 118 on IC die 102 to contact pads or points 120 on substrate 104.

An encapsulate 116, such as a mold compound, epoxy, or other encapsulating material, covers IC die 102 and wire bonds 108 for mechanical and environmental protection.

Figure 1B:
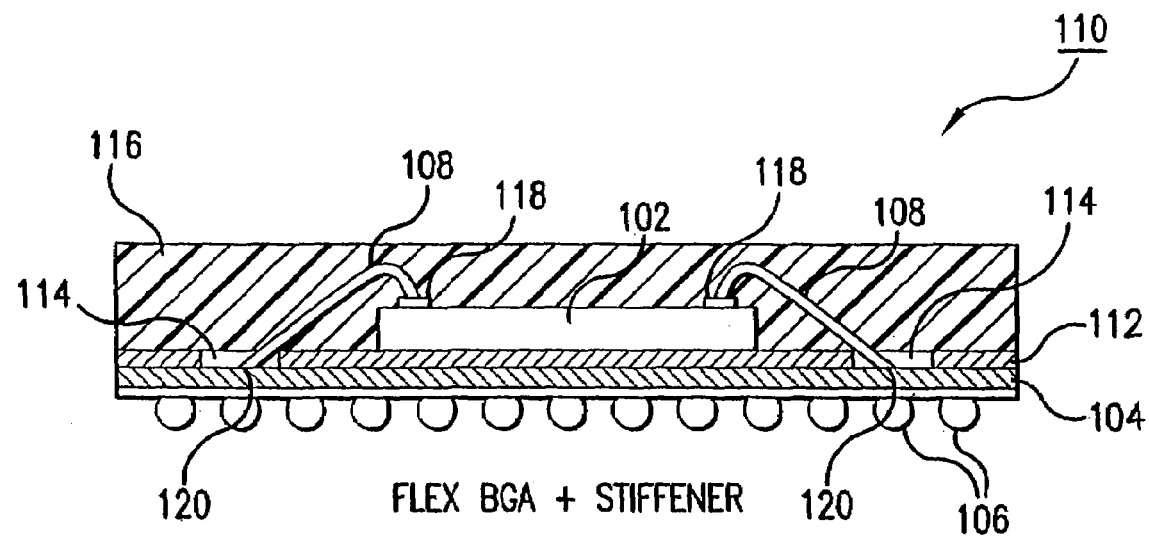

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated or otherwise attached to substrate 104. Stiffener 112 is typically made from a metal, or combination of metals, such as copper, tin, and aluminum, or may be made from a polymer and other materials, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
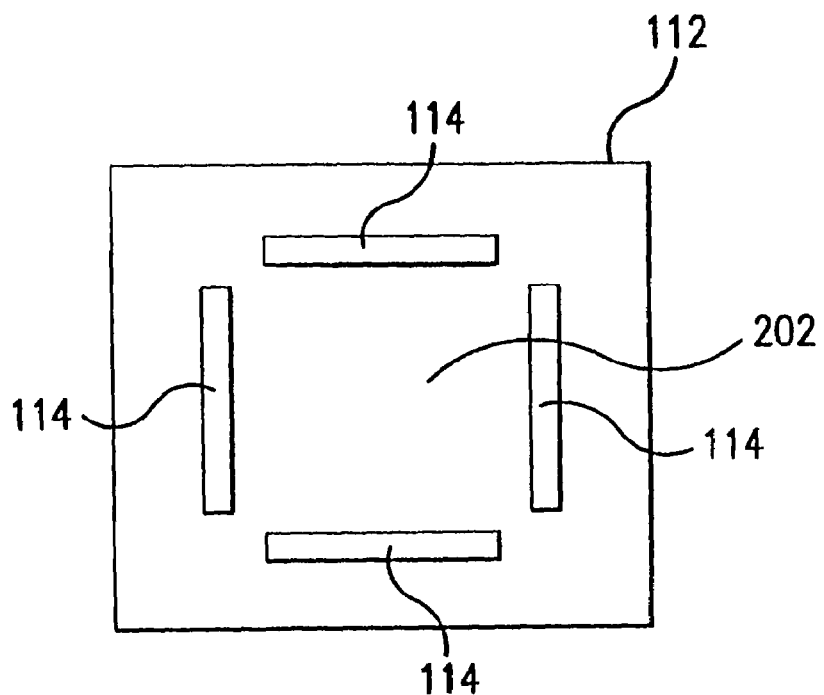
FIG. 2A shows a top view of a stiffener.
Figure 2B:
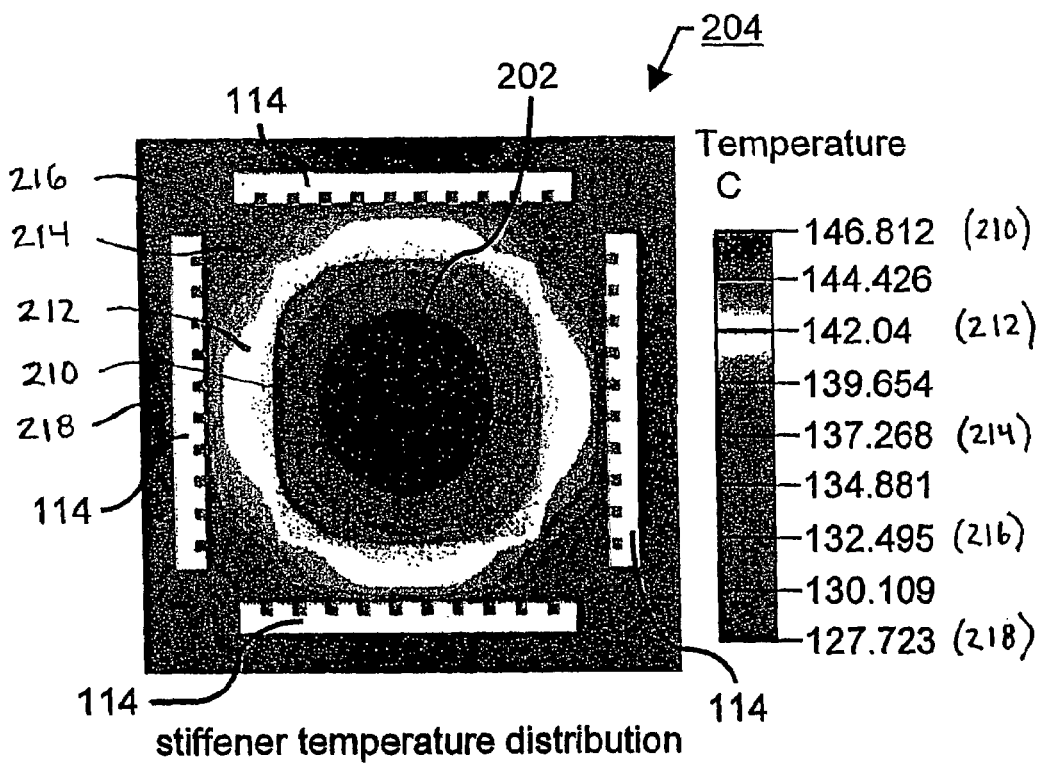
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
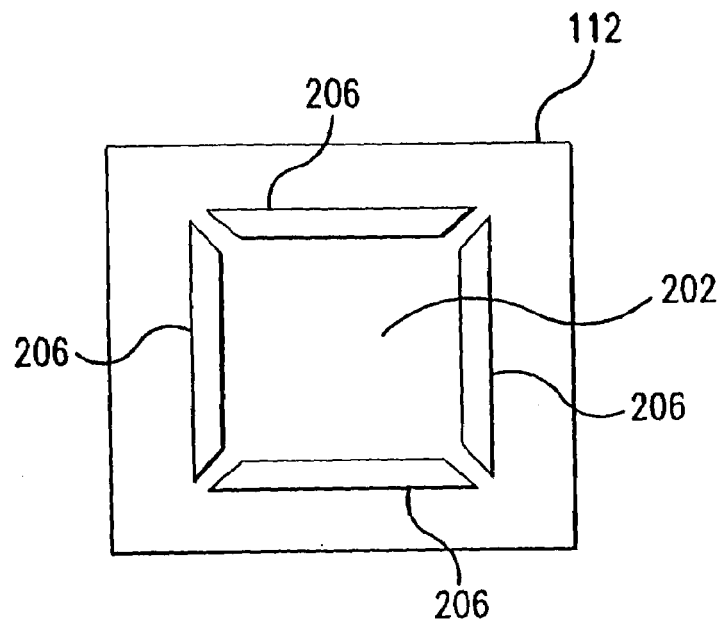
FIG. 2C shows a top view of an alternative stiffener configuration.

FIG. 2C shows a top view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but have a different shape. The different shape can enhance thermal transfer to the outer areas of stiffener 112, for example. Further alternatively shaped openings in stiffener 112 are applicable to the present invention, including elliptical or rounded openings, etc.

Figure 3:
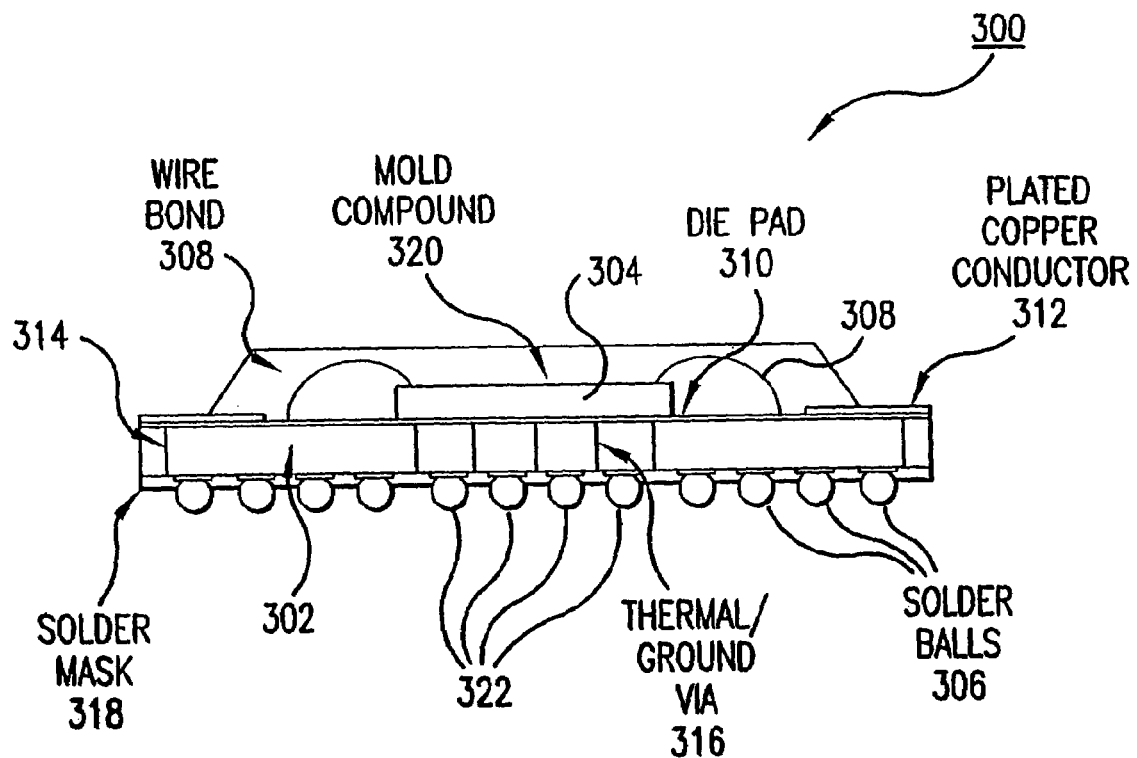
FIG. 3 shows a cross-sectional view of a die-up plastic BGA package.

FIG. 3 shows a cross-sectional view of a conventional die-up PBGA package 300. PBGA package 300 includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate. For example, plastic or organic substrates may include materials such as "BT", which includes a resin called bis-maleimide triazine, and/or "FR-4," which is a fire-retardant epoxy resin-glass cloth laminate material, and/or other similar materials. IC die 304 is mounted to die pad 310. IC die 304 may be attached to die pad 310 with an epoxy, such as a silver-filled epoxy. Wire bonds 308 connect signals of IC die 304 to substrate 302. For instance, gold bonding wire is bonded from aluminum bond pads on IC die 304 to gold-plated contact pads on substrate 302. The contact pads on substrate 302 connect to solder balls 306 attached to the bottom surface of substrate 302, through vias 314 and routing within substrate 302 using copper conductors 312. Thermal/ground vias 316 connect die pad 310 to one or more thermal/ground balls 322 on the center bottom surface of substrate 302. An encapsulate, mold compound, or epoxy 320 covers IC die 304 and wire bonds 308 for mechanical and environmental protection.

Figure 4A:
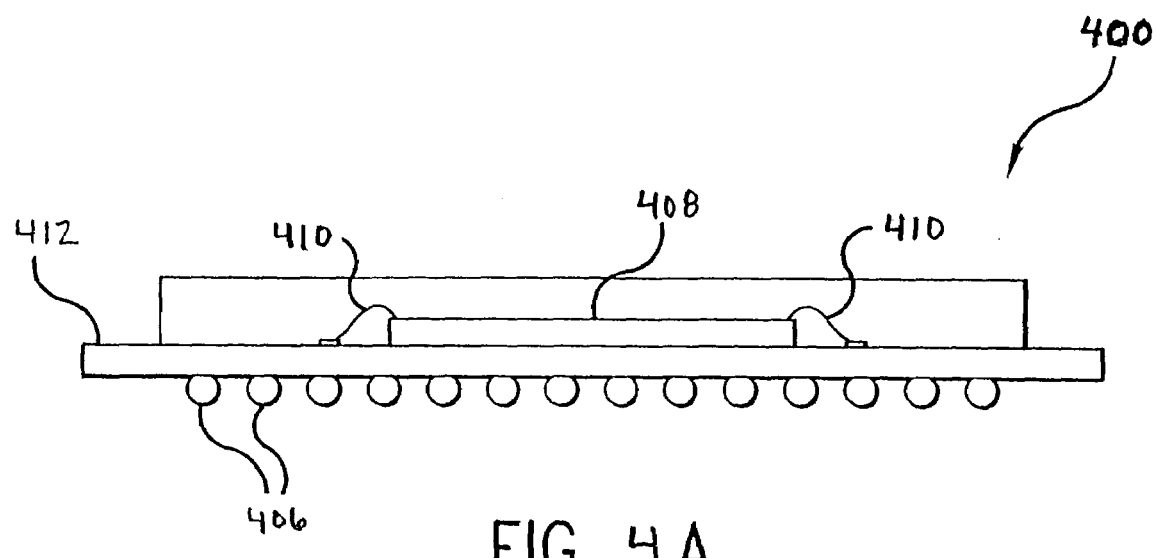
FIG. 4A illustrates a cross-sectional view of a die-up BGA package.
Figure 4B:
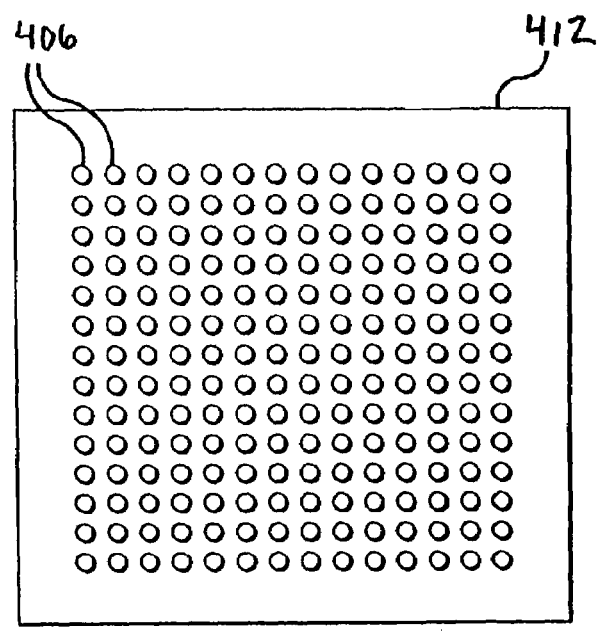
FIGS. 4B and 4C illustrate exemplary solder ball arrangements for the die-up BGA package of FIG. 4A.
Figure 4C:
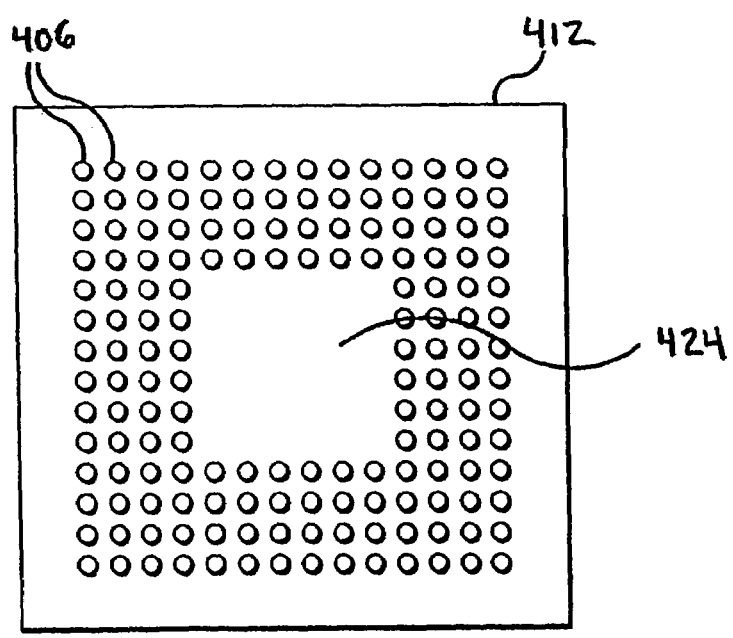

As described above, a BGA package includes an array of solder balls located on a bottom external surface of the package substrate. FIG. 4A illustrates a cross-sectional view of a die-up BGA package 400. FIGS. 4B and 4C illustrate exemplary solder ball arrangements for die-up BGA package 400. As shown in FIG. 4A, BGA package 400 includes an IC die 408 mounted on a substrate 412. IC die 408 is electrically connected to substrate 412 by one or more wire bonds 410. Wire bonds 410 are electrically connected to solder balls 406 underneath substrate 412 through corresponding vias and routing in substrate 412. The vias in substrate 412 can be filled with a conductive material, such as solder, to enhance these connections. Solder balls 406 are attached to substrate 412, and are used to attach the BGA package to a PCB.

Note that although wire bonds, such as wire bonds 410, are shown and described herein, IC dies may be mounted and coupled to a substrate with solder balls located on the bottom surface of the IC die, by a process commonly referred to as "C4" or "flip chip" packaging.

As shown in FIG. 4B, solder balls 406 may be arranged in an array. FIG. 4B shows a 14 by 14 array of solder balls on the bottom surface of BGA package 400. Other sized arrays of solder balls are also applicable to the present invention. Solder balls 406 are reflowed to attach BGA package 400 to a PCB. The PCB may include contact pads to which solder balls 406 are bonded. PCB contact pads are generally made from a metal or combination of metals, such as copper, nickel, tin, and gold.

FIG. 4C shows a bottom view of BGA package 400, with an alternative solder ball array arrangement. BGA package 400 attaches an array of solder balls 406 on a bottom surface of substrate 412. As shown in FIG. 4C, solder balls 406 are located in a peripheral area of the bottom surface of substrate 412, away from a substrate center 424. For example, solder balls 406 on the bottom surface of substrate 412 may be located outside an outer profile area of an IC die mounted on the opposite surface of substrate 412. The solder ball array may be organized in any number of ways, according to the requirements of the particular BGA package application.

The solder ball arrangement shown in FIG. 4C is particularly applicable to embodiments of the present invention described below, such as for attaching a heat spreader/heat sink/heat slug/thermal connector to a bottom surface of a BGA package. The heat spreader/heat sink/heat slug/thermal connector may be connected in substrate center 424, for example.

Figure 6:
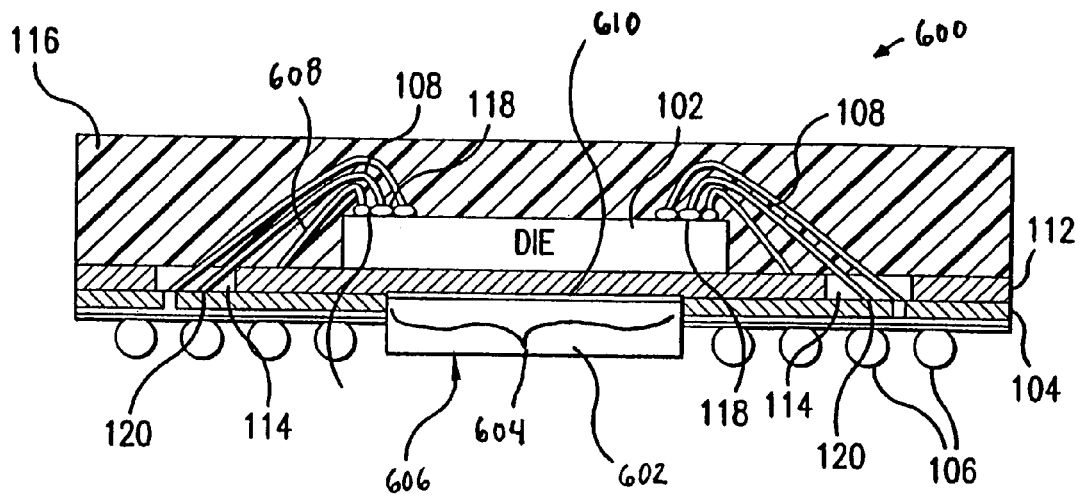
FIG. 6 shows an example BGA package with a heat spreader attached to the package stiffener through an opening in the package substrate.
Figure 7:
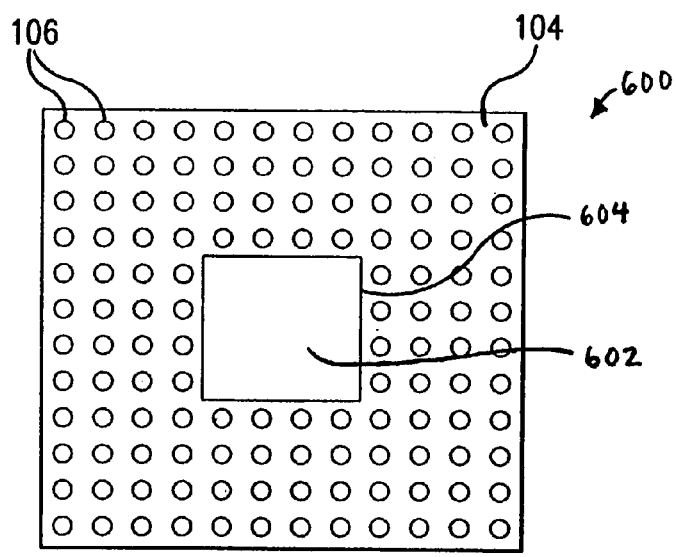
FIG. 7 shows an example view of the bottom surface of the BGA package of FIG. 6.

For example, FIG. 6 shows a cross-sectional view of an example BGA package 600, with a heat spreader 602 attached to a bottom surface. As shown in FIG. 6, heat spreader 602 is attached to a bottom surface of stiffener 112 through an opening 604 in substrate 104. FIG. 7 shows a bottom view of BGA package 600, with heat spreader 602 attached to stiffener 112 through opening 604. Heat spreader 602 is attached to stiffener 112 by an adhesive material 610. Heat spreader 602 may be made from a metal, such as copper, aluminum, and additional metals and combinations/alloys thereof. Furthermore, heat spreader 602 may be made of other electrically and/or thermally conductive materials.

Heat spreader 602 is typically thermally conductive, and therefore aids the transfer of heat generated during operation of IC die 102 out of BGA package 600. Hence, heat spreader 602 may also be referred to as a heat sink, a heat slug, and a thermal connector. Heat from IC die 102 is allowed to conduct through stiffener 112 to heat spreader 602. A bottom surface 606 of heat spreader 602 may be attached to a printed circuit board (PCB), to transfer heat from heat spreader 602 to the PCB. Heat spreader 602 may also be electrically conductive, and therefore may be used as a ground, power, or other signal plane for BGA package 600. One or more wire bonds 608 may couple these electrical signals from IC die 102 to heat spreader 602.

Figure 5:
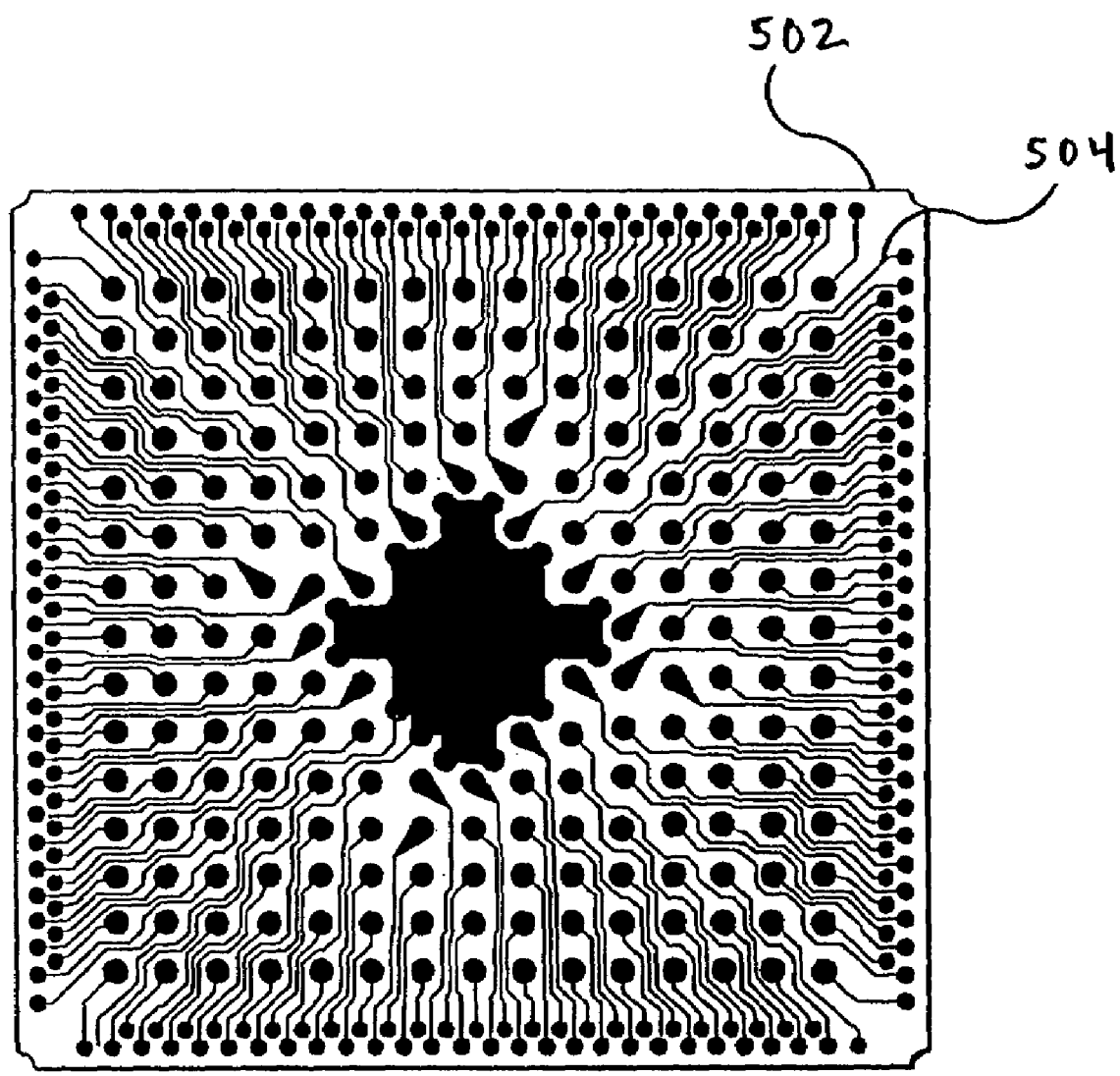
FIG. 5 shows exemplary routing in a substrate layer.

As described above, the BGA package substrate provides electrically conductive vias and routing on one or more electrically conductive layers to connect contact pads for wire bonds on its upper surface to solder balls attached to the bottom substrate surface. For illustrative purposes, FIG. 5 shows solder ball pads and routing 504 in an example bottom substrate layer 502.

Figure 8:
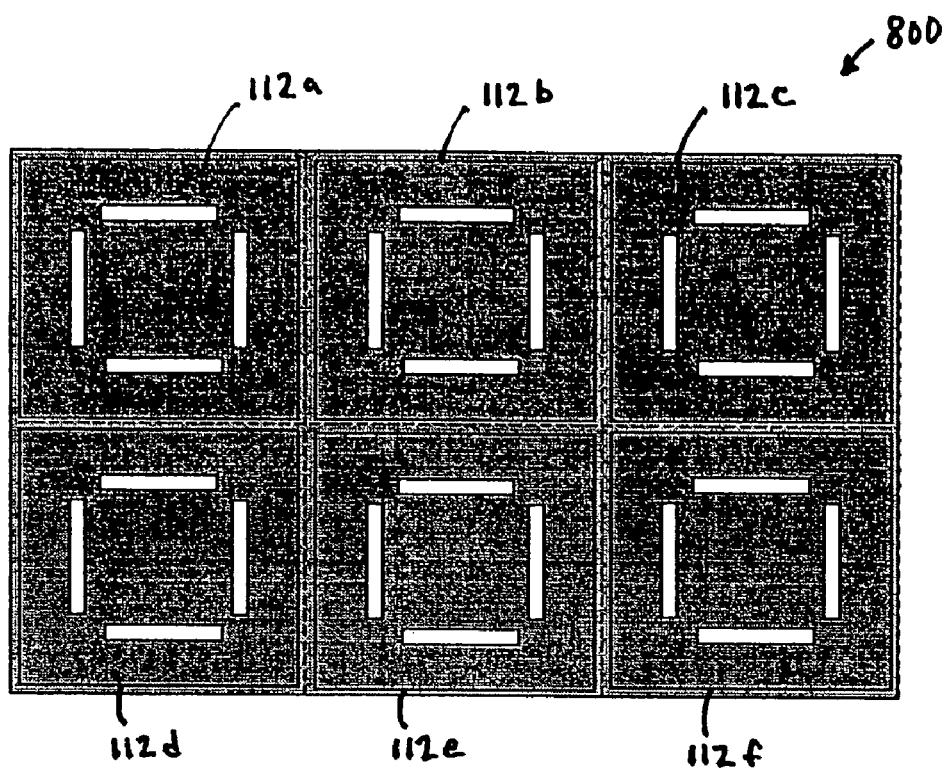
FIG. 8 shows an example panel of stiffeners, according to an embodiment of the present invention.
Figure 9:
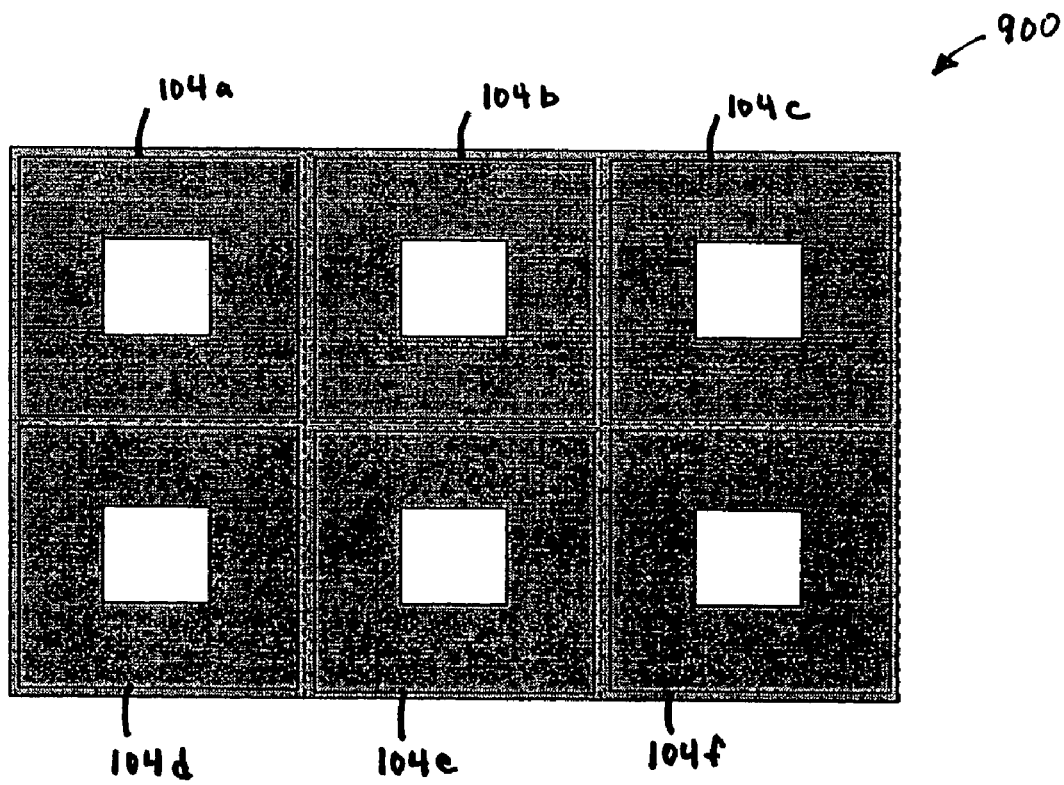
FIG. 9 shows an example panel of substrates, according to an embodiment of the present invention.

BGA packages according to the present invention may be assembled singly, or may be assembled in quantities greater than one at a time. For example, FIG. 8 shows an example panel 800 of stiffeners 112, according to an embodiment of the present invention. FIG. 9 shows an example panel 900 of substrates 104, according to an embodiment of the present invention. Panel 800 includes six stiffeners 112a–112f, and panel 900 shows six substrates 104a–104f. Note that the present invention is applicable to panels having any number of stiffeners 112/substrates 104 for assembling any number of BGA packages. As shown in FIG. 9, substrates 104a–104f each include a centrally located opening 604.

During an assembly process step for assembling a group of BGA packages, panel 900 is attached to panel 800 to form a combined stiffener strip/substrate strip panel. Further assembly process steps may be directed to the combined stiffener strip/substrate strip panel, including, for example: (i) attachment of the IC die to each stiffener/substrate combination in the combined panel, (ii) attachment of wire bonds between the IC die and contact pads on the substrate for each stiffener/substrate combination in the combined panel, (iii) encapsulation of the IC die and wire bonds for environmental protection for each stiffener/substrate combination in the combined panel, and/or (iv) attachment of solder balls to the substrate to each stiffener/substrate combination in the combined panel.

The present invention is directed to reducing harm to IC dies and other BGA package elements during assembly process steps, and to improving assembly process yields, for BGA packages produced singly or in a group. The present invention is also applicable to improving thermal, mechanical, and electrical performance in the BGA package types described herein, and in other BGA package types.

Embodiments for Assembling BGA Packages with IC Die Support

According to embodiments of the present invention, enhancements to an assembly or fabrication process for a BGA package are provided, through the introduction of IC die support structures. This section provides embodiments and description of IC die support structures of the present invention. For illustrative purposes, the present invention is described below in the context of elements of BGA packages 100 and 11 of FIGS. 1A and 1B, but the present invention is not limited to these example BGA package types. The present invention is applicable to all types of BGA packages, including tape and plastic substrate packages such as BGA packages 100, 110, and 300 described above, ceramic substrate BGA packages, and other BGA package types.

Figure 10A:
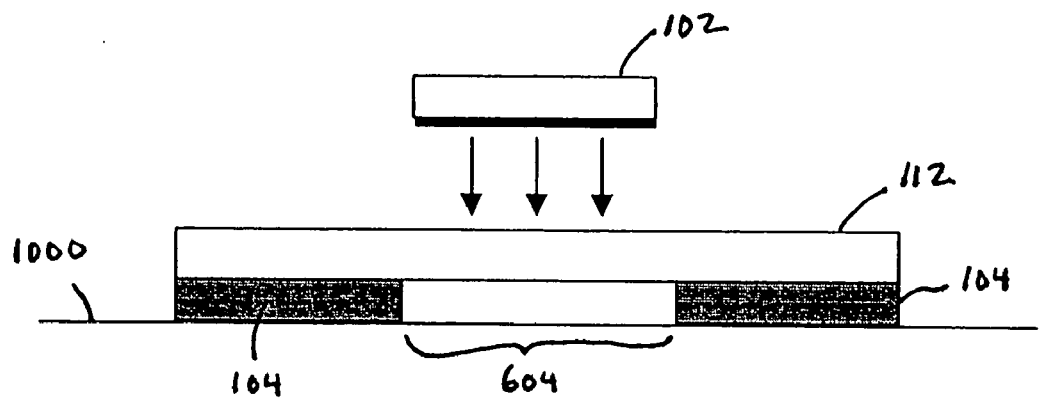
FIG. 10A shows an example cross-sectional view of an IC die being mounted to a stiffener during an assembly process for a BGA package.
Figure 10B:
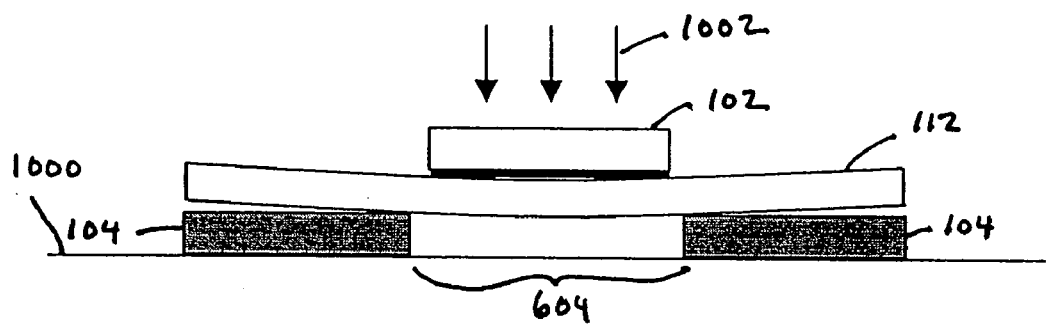
FIG. 10B shows a cross-sectional view illustrating example stress and deformation of elements of the BGA package resulting from the IC die being mounted to the stiffener during the assembly process for the BGA package shown in FIG. 10A.
Figure 10C:
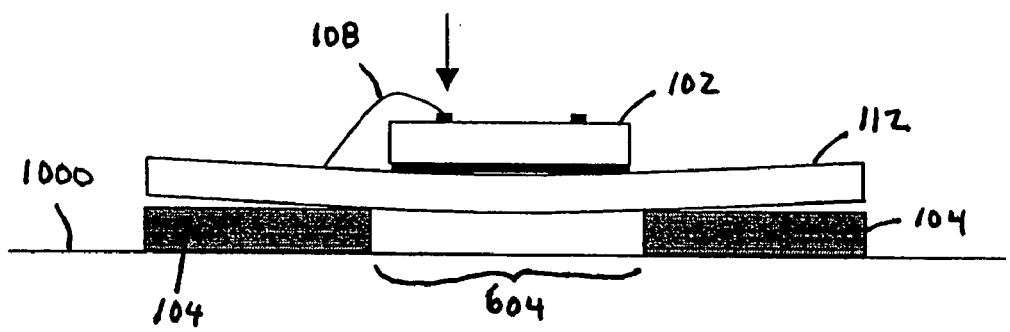
FIG. 10C shows a cross-sectional view illustrating example stress and deformation of elements of a BGA package resulting from a wire bond being attached to an IC die during an assembly process for the BGA package.

During the assembly of BGA packages having an opening in the substrate, such as BGA package 600 shown in FIG. 6, the IC die can experience harmful stresses and shocks. For example, FIG. 10A shows an example cross-sectional view of a mounting process for an IC die 102. As shown in FIG. 10A, stiffener 112 has been attached to substrate 104, which resides against a support surface 1000. Support surface 1000 may or may not be present during assembly of the BGA package. During the assembly process portion shown in FIG. 10A, IC die 102 is being moved toward the top surface of stiffener 112. FIG. 10B shows the IC die 102 contacting the top surface of stiffener 112. Arrows 1002 represent a downward force being exerted on IC die 102 while being mounted to stiffener 112. For example, IC die 102 may be forced and held down on stiffener 112 for a period of time to allow an adhesive material to adhere IC die 102 to stiffener 112. Similar localized forces may also be applied to bond pads on IC die 102 during BGA package assembly processes, including attachment of wire bonds, such as is shown in FIG. 10C.

A force being applied to mount IC die 102 to the top surface of stiffener 112 can cause harm to stiffener 112. As shown in FIG. 10B, stiffener 112 has become deformed (e.g., curved) due to the applied force. As shown in FIG. 10C, attachment of a wire bond 108 to a bond pad of IC die 102 can also deform stiffener 112. The resulting curvature may be temporary or permanent. The outer edges of stiffener 112 curve away from the outer edges of substrate 104, which may detach or weaken the attachment of stiffener 112 to substrate 104. Furthermore, as shown in FIGS. 10B and 10C, the center region of stiffener 112, which has no underlying support due to opening 604 in substrate 104, has become "bowl" shaped. This bowl shape for the center region of stiffener 112 may cause damage to IC die 102. As IC die 102 is being forced downward (such as shown by arrows 1002) onto stiffener 112, a lack of support for the center of IC die 102 exists in the center of the "bowl." Hence, IC die 102 may warp and/or develop one or more cracks due to the lack of uniform support, causing IC die 102 to become inoperable.

Figure 11:
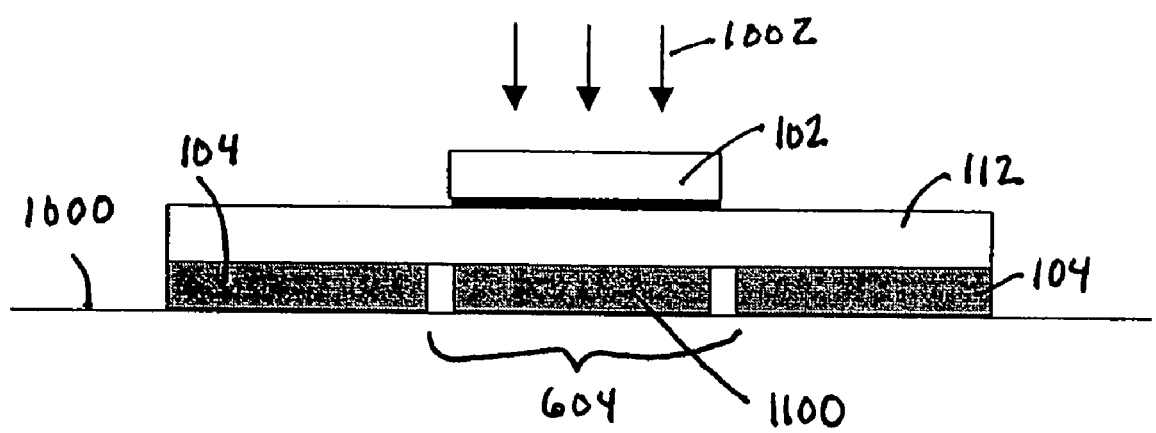
FIG. 11 illustrates a cross-sectional view of an example IC die support structure that at least partially relieves the stress and deformation of elements of the BGA package shown in FIG. 10B, according to an embodiment of the present invention.

FIG. 11 illustrates a cross-sectional view of an example IC die support structure that at least partially relieves stresses to and deformation of elements of a BGA package, according to an embodiment of the present invention. As shown in FIG. 11, an IC die support structure 1100 has been introduced to the mounting configuration shown in FIGS. 10A–10C. IC die support structure 1100 resides in opening 604, between the bottom surface of stiffener 112 and support surface 1000 (when present). IC die support structure 1100 gives support to stiffener 112 when IC die 102 is being mounted to stiffener 112, and during further assembly process operations on IC die 102. These include wire bond attachment and encapsulation processes, for example. As shown in FIG. 11, force 1002 on IC die 102 causes relatively little or no deformation to stiffener 112. Hence, harm to stiffener 112 and IC die 102 is reduced or eliminated.

Furthermore, in embodiments, IC die support structure 1100 is removably held in opening 604. As described below, IC die support structure 1100 may be removed from opening 604 after the relevant assembly process steps have been completed.

In the example of FIG. 11, IC die support structure 1100 is substantially co-planar with substrate 104, and has substantially the same rectangular shape as opening 604 (such as shown for opening 604 in FIG. 7). Furthermore, IC die support structure 1100 has a thickness that is substantially equal to a thickness of substrate 104. In this manner, IC die support structure 1100 fits within opening 604 between stiffener 112 and support surface 1000 (when present), and provides sufficient support to stiffener 112 during assembly operations. In alternative embodiments, IC die support structure 1100 may have shapes other than rectangular, including circular (e.g., as shown in FIG. 18A). Furthermore, IC die support structure 1100 may have a shape different than that of opening 604, including round or elliptical, and any polygon (e.g., as shown in FIGS. 18B and 18C, respectively). Still further, IC die support structure 1100 may have other sizes, including having greater or less thickness than substrate 104.

Example embodiments for holding IC die support structure 1100 in opening 604 are further described as follows. These examples are provided for illustrative purposes, and the present invention is not limited to these examples. These embodiments for holding IC die support structure 1100 may be used with or without support surface 1000 shown in FIG. 10A. Further mechanisms for holding IC die support structure 1100 in opening 604 will be apparent to persons skilled in the relevant art(s) from the teachings herein.

Figure 12:
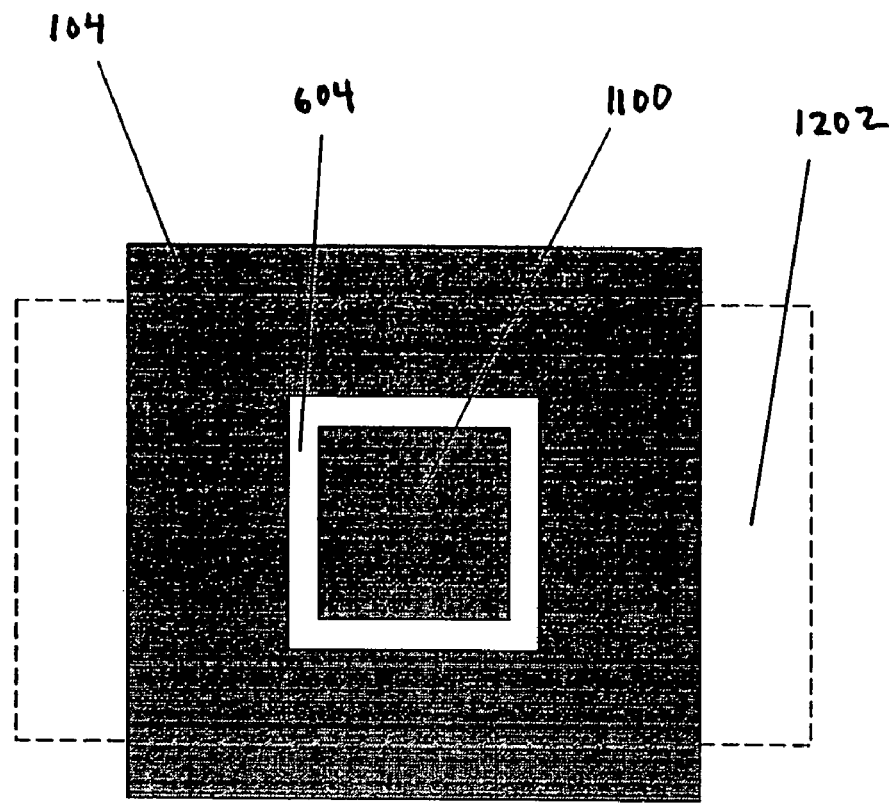
FIG. 12 illustrates a bottom view of a substrate with an example tape-supported IC die support structure, according to an embodiment of the present invention.

FIG. 12 illustrates a top, plan view of substrate 104 having an example IC die support structure 1100, according to an embodiment of the present invention. As shown in FIG. 12, substrate 104 has opening 604 located in a central region of substrate 104. Opening 604 is open at the top and bottom surfaces of substrate 104. Furthermore, IC die support structure 1100 is removably held in opening 604. IC die support structure 1100 is considered removably held in opening 604 because it is attached to an adhesive tape 1202, which is attached to, and may be detached from substrate 104. Adhesive tape 1202 is attached to substrate 104, and holds IC die support structure 1100 in opening 604. After completing relevant assembly process steps for a respective BGA package, adhesive tape 1202 may be detached from the corresponding substrate 104. Detaching adhesive tape 1202 from substrate 104 removes IC die support structure 1100 from opening 604. Adhesive tape 1202 may also be a rigid planar carrier, such as a plate, etc. In such an embodiment, IC die support structure 1100 may be attached to the rigid planar carrier by an adhesive material, such as an adhesive tape, or by other mechanism, including removable and non-removable means.

IC die support structure 1100 as shown in FIG. 12 provides support to stiffener 112 while IC die 102 is being mounted thereto, and while additional assembly processes are being executed on the respective BGA package. Adhesive tape 1202 may be any type of tape having an adhesive material on at least one surface. In embodiments, adhesive tape 1202 may be of a size to attach a single IC die support structure 1100 to a single substrate 104. In alternative embodiments, a single strip of adhesive tape 1202 may be of a size to attach a plurality of IC die supports 1100 to a plurality of substrates 104, such as in substrate strip 900. IC die support structure 1100 can be attached to adhesive tape 1202 at any time before, during, or after adhesive tape 1202 is attached to substrate 104.

Figure 13:
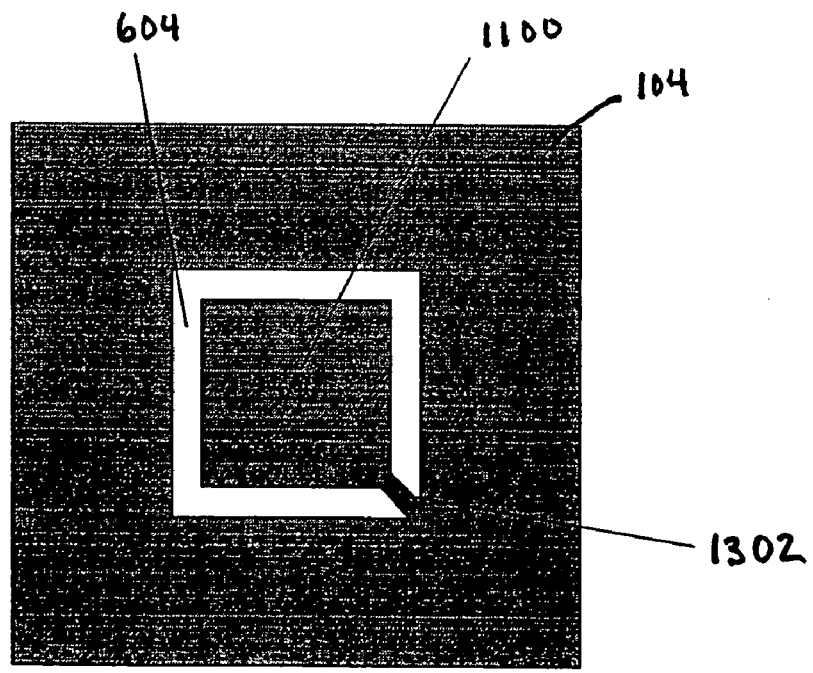
FIGS. 13–15 illustrate bottom and/or top views of substrates with tab-attached IC die support structures, according to embodiments of the present invention.

FIG. 13 illustrates a view of substrate 104 with another example IC die support structure 1100, according to embodiments of the present invention. As shown in FIG. 13, substrate 104 has opening 604 located in a central region that is open at the top and bottom surfaces of substrate 104. Furthermore, similarly to the embodiment shown in FIG. 12, IC die support structure 1100 shown in FIG. 13 is removably held in opening 604. In FIG. 13, IC die support structure 1100 is considered removably held in opening 604 because it is held in opening 604 by a breakable stud or tab 1302. Tab 1302 may be broken to release IC die support structure 1100 from opening 604. Once IC die support structure 1100 is released by breaking tab 1302, it may be physically removed or may be allowed to drop from opening 604 on its own.

In embodiments, tab 1302 is made from a material external from substrate 104 that is positioned in opening 604 to hold IC die support structure 1100. In another embodiment, tab 1302 and IC die support structure 1100 are portions of substrate 104 that remain in opening 604 when opening 604 is formed in substrate 104. For example, tab 1302 and IC die support structure 1100 may be formed with opening 604 in substrate 104 by cutting a non-continuous line in the shape of a rectangle, or other shape, through substrate 104 in a center region. The substrate material that is removed during the cutting process is removed from the gap formed between substrate 104 and IC die support structure 1100. In such an embodiment, opening 604 may be formed around IC die support structure and tab 1302 by sawing, cutting, drilling, machining, by laser, and other ways.

Figure 14:
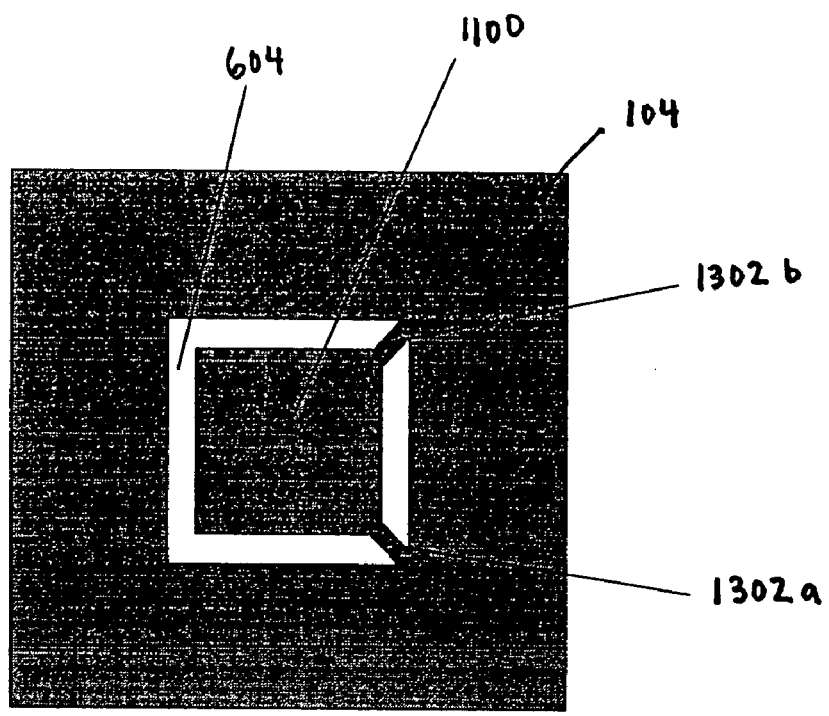
Figure 15:
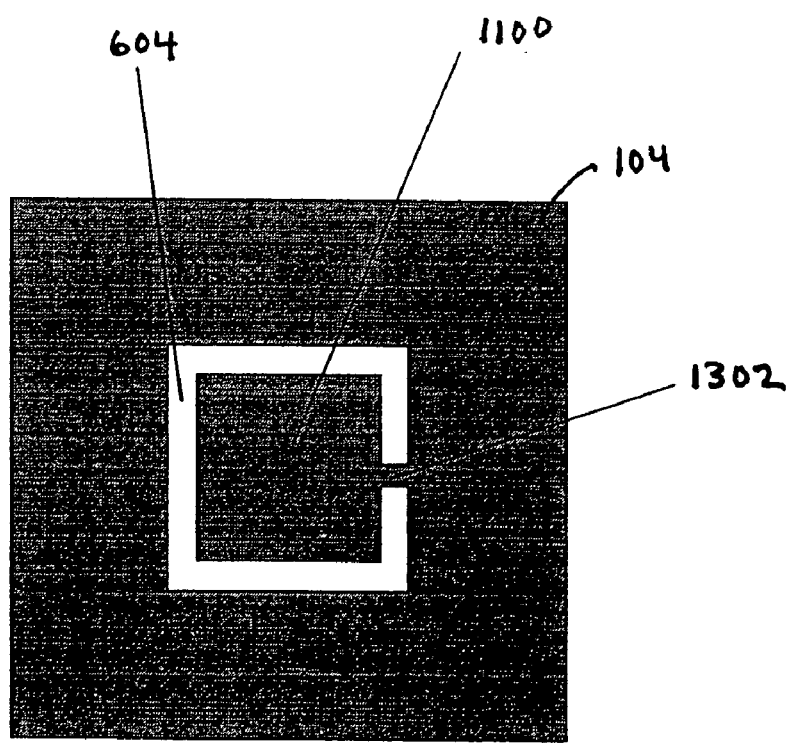

IC die support structure 1100 as shown in FIG. 13 provides support to stiffener 112 while IC die 102 is being mounted thereto, and while additional assembly processes are being executed on the respective BGA package. The example embodiment of FIG. 13 shows a single tab 1300 located in a corner of opening 604, that removably holds IC die support structure 1100 in opening 604. FIGS. 14 and 15 illustrate views of substrate 104 with IC die support structure 1100 removably held by one or more tabs 1302, according to further embodiments of the present invention. FIG. 14 shows a first tab 1302a removably holding IC die support structure 1100 in a first corner of opening 604, and a second tab 1302b removably holding IC die support structure 1100 in a second corner of opening 604. FIG. 15 shows tab 1302 removably holding IC die support structure 1100 to a middle area of an edge of opening 604. Any number of one or more tabs 1302 may be used to removably hold IC die support structure 1100 in opening 604. Furthermore, the one or more tabs 1302 may be located anywhere in the corners or along the edges of opening 604.

In embodiments, as described above, IC die support structure 1100 may be a substrate portion formed from opening 604 of substrate 104, and hence be made from the same material as substrate 104. In further embodiments, IC die support structure 1100 can be made from a substrate material that is the same as or different from that of substrate 104. These substrate materials include tape, plastic, and/or ceramic substrate materials. Furthermore, IC die support structure 1100 may be made from a plastic material, such as BT and/or FR4, and/or a ceramic. IC die support structure 1100 can also be made from a metal, such as copper, aluminum, tin, nickel, iron, other metals, and combinations/alloys thereof. IC die support structure 1100 may be made from other materials as well.

Figure 16:
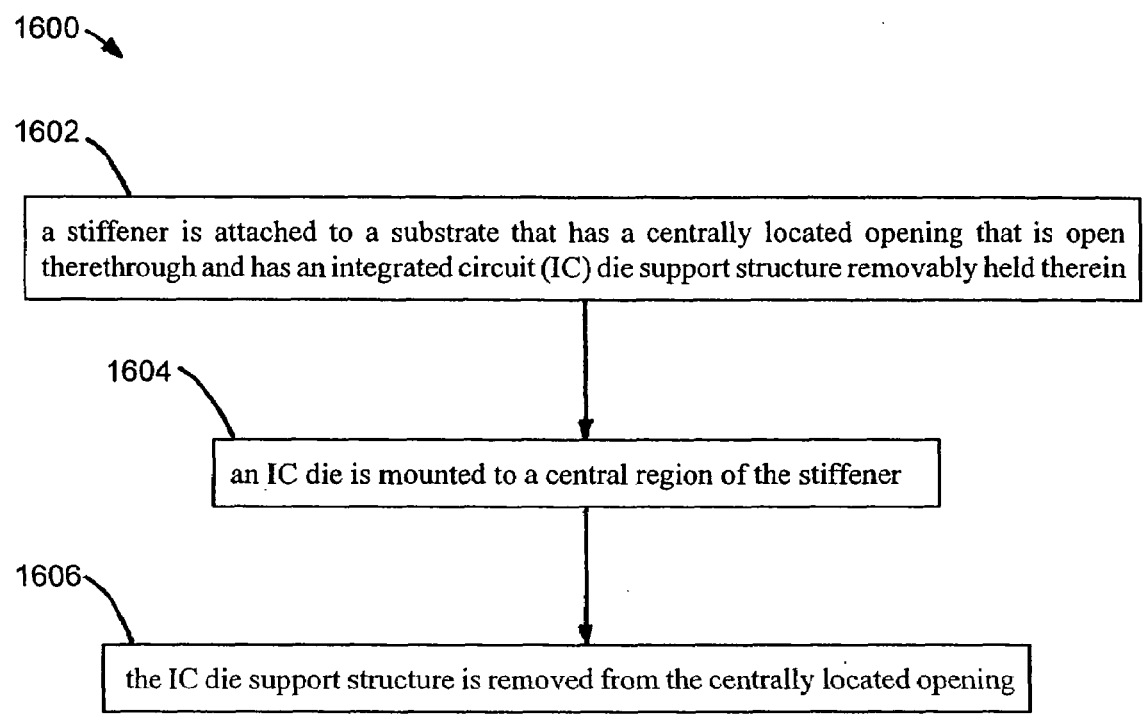
FIG. 16 shows a flowchart providing example steps for assembling a BGA package with IC die support, according to embodiments of the present invention.

FIG. 16 shows a flowchart 1600 providing steps for assembling a BGA package according to one or more embodiments of the present invention.

Other operational and structural embodiments will be apparent to persons skilled in the relevant art(s) based on the following discussion. These steps are described in detail below.

Flowchart 1600 begins with step 1602. In step 1602, a stiffener is attached to a substrate that has a centrally located opening that is open therethrough and has an integrated circuit (IC) die support structure removably held therein. For example, the stiffener is stiffener 112 and the substrate is substrate 104, which are attached to each other, as shown in FIG. 11. As shown in FIG. 11, substrate 104 as a centrally located opening 604 that is open at the top and bottom surfaces of substrate 104. Furthermore, opening 604 has. IC die support structure 1100 removably positioned therein.

In step 1604, an IC die is mounted to a central region of the stiffener. For example, as shown in FIG. 11, IC die 102 is mounted to the top surface of stiffener 112, in a central region that is opposite to opening 604 in substrate 104.

In step 1606, the IC die support structure is removed from the centrally located opening. For example, as described above, after one or more assembly operations are performed on the BGA package, IC die support structure 1100 is removed from opening 604.

In embodiments, step 1604 includes the step where the IC die support structure is allowed to support the central region of the stiffener while the IC die is being mounted to the central region of the stiffener. For example, IC die support structure 1100 supports stiffener 112 in the region adjacent to opening 604 in substrate 104 when assembly operations are performed that involve forces upon IC die 102, such as mounting IC die 102 to stiffener 112, attaching wire bonds 108/608, and applying encapsulate 116.

In an embodiment, flowchart 1600 may include the additional step where an adhesive tape is applied to the substrate to which the IC die support structure is attached so that the IC die support structure is removably held within the centrally located opening. For example, the adhesive tape is adhesive tape 1202, as shown in FIG. 12. Adhesive tape 1202 has IC die support structure 1100 attached thereto, and is applied to substrate 104. IC die support structure 1100 is located and removably held in opening 604 by adhesive tape 1202.

In such an embodiment, step 1606 may include the step where the applied adhesive tape is detached from the substrate to remove the IC die support structure from the centrally located opening. For example, as described above, adhesive tape 1202 may be removed from substrate 104. Because IC die support structure 1100 is attached to adhesive tape 1202, IC die support structure 1100 is removed from opening 604 when adhesive tape 1202 is detached.

Figure 17A:
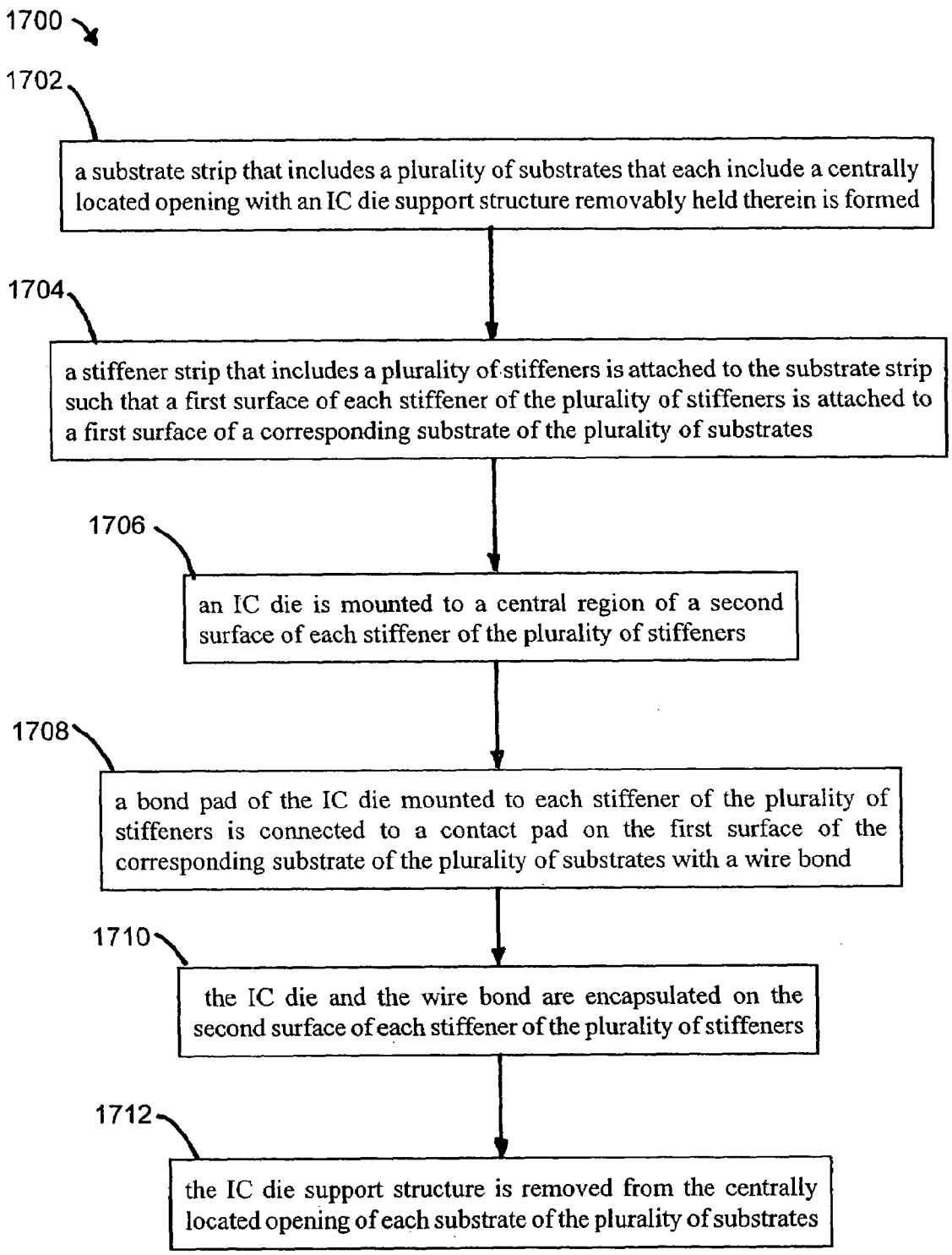
FIGS. 17A and 17B show flowcharts providing example steps for assembling a plurality of BGA packages, according to embodiments of the present invention.
Figure 17B:
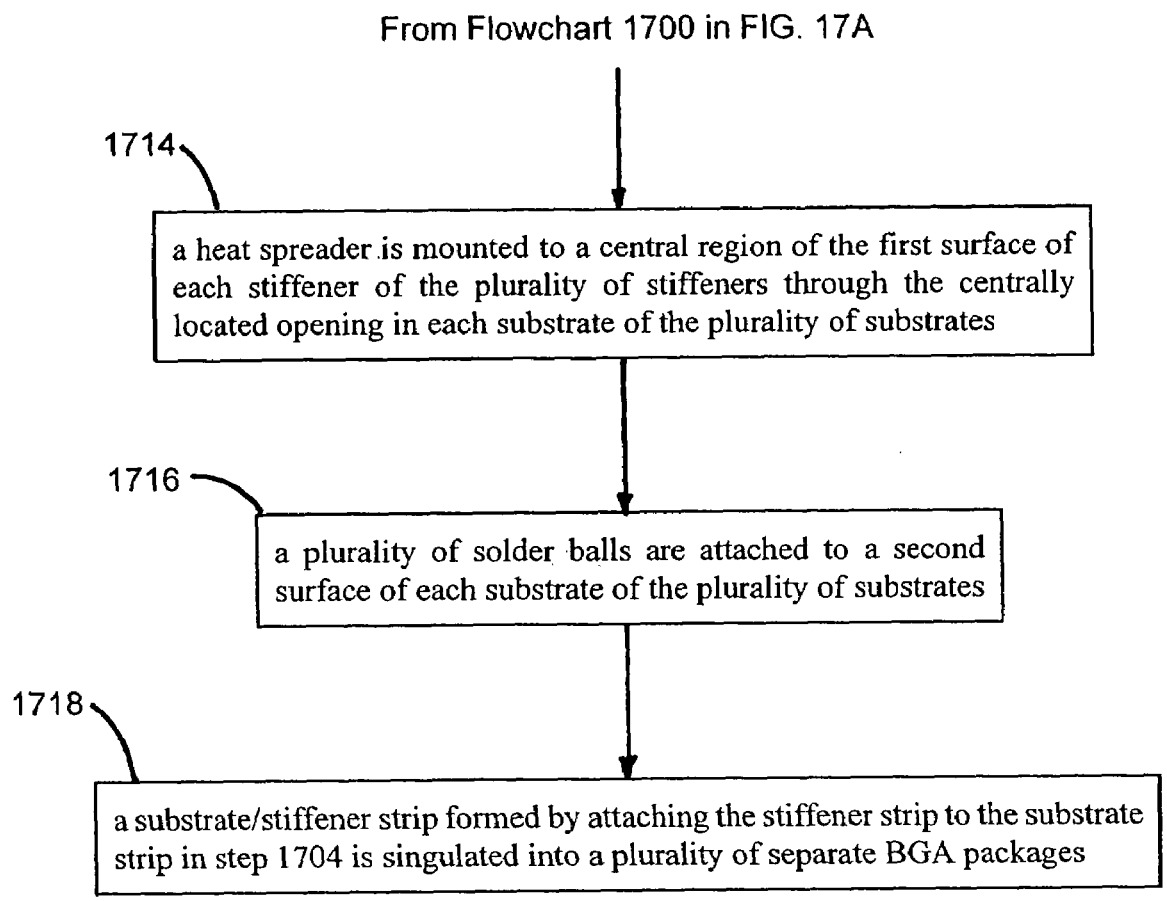

FIG. 17A shows a flowchart 1700 providing steps for assembling a plurality of BGA packages according to one or more embodiments of the present invention. FIG. 17B provides additional optional steps, according to further embodiments of the present invention. Other operational and structural embodiments will be apparent to persons skilled in the relevant art(s) based on the following discussion. These steps are described in detail below.

Flowchart 1700 begins with step 1702. In step 1702, a substrate strip that includes a plurality of substrates that each include a centrally located opening with an IC die support structure removably held therein is formed. For example, the substrate strip is substrate strip 900, as shown in FIG. 9. Substrate strip 900 includes a plurality of substrates 104, that each include an opening 604. Similarly to the single substrate example of FIG. 11, stiffener strip 900 is formed so that each substrate of the plurality of substrates 104 include an IC die support structure 1100 removably held therein.

In step 1704, a stiffener strip that includes a plurality of stiffeners is attached to the substrate strip such that a first surface of each stiffener of the plurality of stiffeners is attached to a first surface of a corresponding substrate of the plurality of substrates. For example, the stiffener strip is stiffener strip 800, as shown in FIG. 8. As shown in FIG. 8, stiffener strip 800 includes a plurality of stiffeners 112. Substrate strip 900 and stiffener strip 800 are attached to each other to form a substrate strip/stiffener strip combination.

In step 1706, an IC die is mounted to a central region of a second surface of each stiffener of the plurality of stiffeners. For example, similarly to that shown in FIG. 11 for a single stiffener, an IC die 102 is mounted to the top surface of each stiffener of the plurality of stiffeners 112 of stiffener strip 800, in a central region that is opposite to opening 604 in the respective substrate 104.

In step 1708, a bond pad of the IC die mounted to each stiffener of the plurality of stiffeners is connected to a contact pad on the first surface of the corresponding substrate of the plurality of substrates with a wire bond. For example, similar to the single IC die example of FIG. 6, a wire bond 108 may be used to connect a bond pad of IC die 102 to a contact pad on the top surface of substrate 104, for each IC die 102 and each corresponding substrate of the plurality of substrates 104.

In step 1710, the IC die and the wire bond are encapsulated on the second surface of each stiffener of the plurality of stiffeners. For example, as shown in FIG. 6 for a single IC die 102, an encapsulate 116 may be applied to the BGA package to encapsulate IC die 102 and wire bonds 108/608 to the top surface of each stiffener of the plurality of stiffeners 112.

In step 1712, the IC die support structure is removed from the centrally located opening of each substrate of the plurality of substrates. For example, as described above for a single IC die support structure 1100, after one or more assembly operations are performed on the substrate strip/stiffener strip combinations, IC die support structure 1100 is removed from each opening 604.

In embodiments, one or more of steps 1706, 1708, and 1710 include the step where the IC die support structure is allowed to support the central region of the stiffener during the respective step(s). The assembly processes described above place respective forces upon IC die 102. IC die support structure 1100 supports stiffener 112 during these assembly process steps to prevent substantial deformation of stiffener 112, and damage to IC die 102.

In an embodiment, step 1702 may include the step where an adhesive tape to which a plurality of IC die support structures are attached is applied to the substrate strip so that an IC die support structure of the plurality of IC die support structures is removably held within the centrally located opening of each substrate of the plurality of substrates. For example, the adhesive tape is adhesive tape 1202, as shown for a single substrate 104 in FIG. 12. Adhesive tape 1202 has IC die support structure 1100 for each opening 604 attached thereto, and is applied to substrate strip 900. An IC die support structure 1100 is located and removably held in each opening 604 by adhesive tape 1202. Note that a single adhesive tape 1202 may removably hold all IC die support structures 1100, or a separate adhesive tape 1202 may be used for each IC die support structure 1100 in the substrate strip/stiffener strip combination.

In such an embodiment, step 1712 may include the step where the applied adhesive tape is detached from the substrate strip to remove the IC die support structure held within the centrally located opening of each substrate of the plurality of substrates. For example, as described above, adhesive tape 1202 may be removed from the plurality of substrates 104. Because each IC die support structure 1100 is attached to adhesive tape 1202, each IC die support structure 1100 is removed from the respective opening 604.

In another embodiment, step 1702 may include the step where the centrally located opening is formed in each substrate of the plurality of substrates such that a substrate portion remains removably held in the centrally located opening of each substrate of the plurality of substrates by at least one substrate tab as the IC die support structure. For example, similarly to the single substrate examples shown in FIGS. 13–15, opening 604 may be formed for each substrate in the plurality of substrates 104 such that a portion of the substrate remains within each opening 604 as IC die support structure 1100. At least one substrate tab, such as tab 1302, removably holds IC die support structure 1100 in each opening 604.

In such an embodiment, step 1712 may include the step where the at least one substrate tab removably holding the substrate portion in the centrally located opening of each substrate of the plurality of substrates is broken to release the IC die support structure removably held within the centrally located opening of each substrate of the plurality of substrates. For example, as described above for a single substrate 104, a respective tab 1302 may be broken to release IC die support structure 1100 in each opening 604, so that each IC die support structure 1100 may be removed.

FIG. 17B shows additional steps for flowchart 1700. In embodiments, any number of one or more steps shown in FIG. 17B may be combined with flowchart 1700 shown in FIG. 17A. In an embodiment, flowchart 1700 may include the additional step of step 1714, as shown in FIG. 17B. In step 1714, a heat spreader is mounted to a central region of the first surface of each stiffener of the plurality of stiffeners through the centrally located opening in each substrate of the plurality of substrates. For example, as shown in FIG. 6 for a single BGA package, a heat spreader 602 may be coupled to each stiffener 112 through the opening 604 in the respective substrate 104 for each substrate/stiffener combination in the substrate strip/stiffener strip combination, after removal of IC die support structures 1100.

In an embodiment, flowchart 1700 may include the additional step of step 1716, as shown in FIG. 17B. In step 1716, a plurality of solder balls are attached to a second surface of each substrate of the plurality of substrates. For example, as shown in FIG. 6 for a single BGA package, for each substrate of the plurality of substrates 104, a plurality of solder balls 106 may be applied to the bottom surface of substrate 104.

In an embodiment, flowchart 1700 may include the additional step of step 1718, as shown in FIG. 17B. In step 1718, a substrate/stiffener strip formed by attaching the stiffener strip to the substrate strip in step 1704 is singulated into a plurality of separate BGA packages. For example, after assembly processes have been performed on the stiffener strip/substrate strip combination, each stiffener/substrate combination may be separated from the stiffener strip/substrate strip combination to form a plurality of BGA packages. Sawing, cutting, machining, and other processes may be used to perform the separation.

Further steps for the processes of flowcharts 1600 and 1700 shown in FIGS. 16, 17A, and 17B will be known to persons skilled in the relevant art(s) from the teachings herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. A ball grid array (BGA) package with IC die support apparatus for use during assembly, comprising:
   a substantially planar substrate having opposing first and second surfaces, and having an opening through said substrate in a central region that is open at said first surface and said second surface;
   a stiffener having opposing first and second surfaces, said first surface of said stiffener attached to said second surface of said substrate;
   an IC die mounted to said second surface of said stiffener in a central region opposite said opening through said substrate; and
   an IC die support structure removably held in said opening.

2. The BGA package of claim 1, wherein said IC die support structure is substantially co-planar with said substrate, and said IC die support structure has a thickness that is substantially equal to a thickness of said substrate.

3. The BGA package of claim 1, wherein the IC die support structure comprises a substrate portion, the IC die support structure further comprising:
   at least one breakable substrate tab that removably holds said IC die support structure in said opening; and enables said IC die support structure to be released from said opening when said at least one breakable substrate tab is broken.

4. The BGA package of claim 3, wherein said opening, said substrate portion, and said at least one breakable substrate tab have substantially rectangular shapes.

5. The BGA package of claim 1, further comprising:
   an adhesive tape applied to said IC die support structure and said first surface of said substrate that removably holds said IC die support structure within said opening and enables said IC die support structure to be removed from said opening when said adhesive tape is detached from said substrate.

6. The BGA package of claim 1, wherein said IC die support structure comprises a substrate material.

7. The BGA package of claim 1, wherein said IC die support structure comprises at least one of a BT and FR4.

8. The BGA package of claim 1, wherein said IC die support structure comprises a ceramic.

9. The BGA package of claim 1, wherein said IC die support structure comprises at least one metal.

10. The BGA package of claim 1, wherein said IC die support structure comprises a metal alloy.

11. The BGA package of claim 1, wherein said IC die support structure comprises a plastic.

12. The BGA package of claim 1, wherein said IC die support structure has a shape substantially equal to a shape of said opening.

13. The BGA package of claim 12, wherein said IC die support structure is substantially rectangular shaped.

14. The BGA package of claim 1, further comprising:
at least one breakable tab that removably holds said IC die support structure in said opening and enables said IC die support structure to be released from said opening when said at least one breakable tab is broken.

15. The BGA package of claim 14, wherein said at least one breakable tab is located in a corner of said opening.

16. The BGA package of claim 14, wherein said at least one breakable tab is located along an edge of said opening.

17. The BGA package of claim 5, wherein said adhesive tape includes a tape having an adhesive material on at least one surface.

18. The BGA package of claim 5, wherein said adhesive tape is configured to attach a single IC die support structure to a single substrate.

19. The BGA package of claim 5, wherein said adhesive tape is configured to attach a plurality of IC die support structures to a plurality of substrates.

20. The BGA package of claim 1, further comprising:
a rigid planar carrier attached to said IC die support structure and said first surface of said substrate that removably holds said IC die support structure within said opening and enables said IC die support structure to be removed from said opening when said rigid planar carrier is detached from said substrate.

21. The BGA package of claim 20, wherein said IC die support structure is attached to said rigid planar carrier by an adhesive material.

22. The BGA package of claim 1, wherein said IC die support structure has one of a substantially circular, elliptical, or polygonal shape.

* * * * *